United States Patent
Sohn

(10) Patent No.: US 9,143,119 B2
(45) Date of Patent: Sep. 22, 2015

(54) COMPARATOR AND ANALOG-TO-DIGITAL CONVERTER USING THE SAME

(71) Applicant: SK hynix Inc., Gyeonggi-do (KR)

(72) Inventor: Young-Chul Sohn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/106,822

(22) Filed: Dec. 15, 2013

(65) Prior Publication Data

US 2015/0123832 A1    May 7, 2015

(30) Foreign Application Priority Data

Nov. 4, 2013   (KR) .................. 10-2013-0132854

(51) Int. Cl.
| | |
|---|---|
| H03M 1/12 | (2006.01) |
| H03K 5/1252 | (2006.01) |
| H03K 5/24 | (2006.01) |
| H03M 1/34 | (2006.01) |
| H04N 5/378 | (2011.01) |

(52) U.S. Cl.
CPC ............ *H03K 5/1252* (2013.01); *H03K 5/2481* (2013.01); *H03M 1/34* (2013.01); *H04N 5/378* (2013.01)

(58) Field of Classification Search
CPC ....... H03M 1/56; H03M 1/1023; H03M 1/34; H03M 1/12; H03M 1/08; H03M 1/1295; H03M 1/0607

USPC ......... 341/118, 120, 135, 136, 155, 158, 159, 341/169, 170

See application file for complete search history.

(56) References Cited

U.S. PATENT DOCUMENTS

| | | | | |
|---|---|---|---|---|
| 6,498,576 | B1* | 12/2002 | Tian et al. ................... | 341/155 |
| 7,145,494 | B2* | 12/2006 | Mizuguchi et al. ........... | 341/155 |
| 7,567,280 | B2* | 7/2009 | Muramatsu et al. .......... | 348/294 |
| 7,612,816 | B2* | 11/2009 | Neaves ......................... | 348/302 |
| 7,755,686 | B2* | 7/2010 | Toyama et al. ............... | 348/300 |
| 8,606,051 | B2* | 12/2013 | Wang et al. ................... | 382/312 |
| 8,760,213 | B2* | 6/2014 | Saito et al. ................... | 327/408 |
| 2007/0030190 | A1* | 2/2007 | Lee .............................. | 341/155 |
| 2009/0184236 | A1* | 7/2009 | Kawaguchi et al. ........ | 250/208.1 |
| 2013/0009800 | A1* | 1/2013 | Yang et al. ................... | 341/155 |

FOREIGN PATENT DOCUMENTS

KR    1019990017325    3/1999

* cited by examiner

*Primary Examiner* — Linh Nguyen
(74) *Attorney, Agent, or Firm* — IP & T Group LLP

(57) ABSTRACT

A comparator includes a first amplification unit suitable for differentially amplifying a pixel signal and a ramp signal, a second amplification unit suitable for amplifying a signal outputted from the first amplification unit and outputting a comparison result, a current control unit suitable for controlling a current flow in response to the comparison result and a current compensation and noise removal unit suitable for compensating for current and removing noise under control of the current control unit.

19 Claims, 7 Drawing Sheets

COMPARATOR AND ANALOG-TO-DIGITAL CONVERTER USING THE SAME

CROSS-REFERENCE TO RELATED APPLICATIONS

The present application claims priority of Korean Patent Application No. 10-2013-0132854, filed on Nov. 4, 2013, which is incorporated herein by reference in its entirety.

BACKGROUND

1. Field

Exemplary embodiments of the present invention relate to an image sensor circuit, and more particularly, to a comparator capable of current compensation and noise reduction, and an analog-to-digital converter using the same.

2. Description of the Related Art

At the present time, with an increase in demands for a high frame rate of an image sensor, a read-out scheme of the image sensor has been changed from a serial analog-to-digital conversion (ADC) to a column parallel ADC in order to reflect the demands.

A single-slope ADC (SS-ADC) adapts the column parallel ADC scheme. In the column parallel ADC structure, since an ADC is arranged to each of columns, many more ADCs are necessary as an image size increases.

For this reason, the aforementioned conventional art has a concern that power noise such as current noise, which is generated in one column, is reflected in an image by an amount corresponding to the total number of columns (for example, about 2500 columns in a 5M CMOS image sensor). The power noise reflected in the image results in horizontal noise (HN). Furthermore, the conventional art has a concern that output noise is generated in every comparator of the ADC arranged at each of columns. The output noise is voltage noise kicked back from an output terminal of the comparator through a parasitic capacitor.

SUMMARY

Various exemplary embodiments of the present invention are directed to a comparator for compensating for current and removing noise, and an analog-to-digital converter using the same.

In accordance with an exemplary embodiment of the present invention, a comparator may include a first amplification unit suitable for differentially amplifying a pixel signal and a ramp signal, a second amplification unit suitable for amplifying a signal outputted from the first amplification unit and outputting a comparison result, a current control unit suitable for controlling a current flow in response to the comparison result and a current compensation and noise removal unit suitable for compensating for current and removing noise under control of the current control unit.

In accordance with an exemplary embodiment of the present invention, an analog-to-digital converter may include a comparison unit suitable for receiving a pixel signal and a ramp signal, comparing the pixel signal with the ramp signal, outputting a comparison result, and controlling a current flow in response to the comparison result to compensate for current and remove noise and a counting unit suitable for counting the comparison result.

In accordance with an exemplary embodiment of the present invention, a comparator may include a first amplification unit suitable for comparing a pixel signal and a ramp signal, a second amplification unit suitable for amplifying an output of the first amplification unit and outputting a comparison result to an output terminal of the comparator and a replica unit suitable for generating a first inner current flow in response to the comparison result, wherein the second amplification unit and the replica unit are commonly coupled to the output terminal of the comparator, wherein the second amplification unit generate a second inner current flow during activated, and wherein the replica unit changes an amount of the first inner current flow inversely to the amount of a second inner current.

According to an exemplary embodiment of the present invention, it is possible to compensate for current and remove noise using a replica circuit.

According to an exemplary embodiment of the present invention, it is possible to reduce horizontal noise (HN) by removing power noise such as current noise that is generated in a comparator of a single-slope ADC (SS-ADC), and to remove output noise such as voltage noise kicked back from an output terminal of the comparator through a parasitic capacitor.

According to an exemplary embodiment of the present invention, a current profile, which may be generated in the single-slope ADC, is improved through current compensation so that it is possible to realize a comparator with a simple structure. Furthermore, compared with an ADC with two static amplifiers, an amount of current assumption is reduced. Also, low noise operation may be achieved such that limitation of an operation range is reduced.

DETAILED DESCRIPTION

Figure 1:
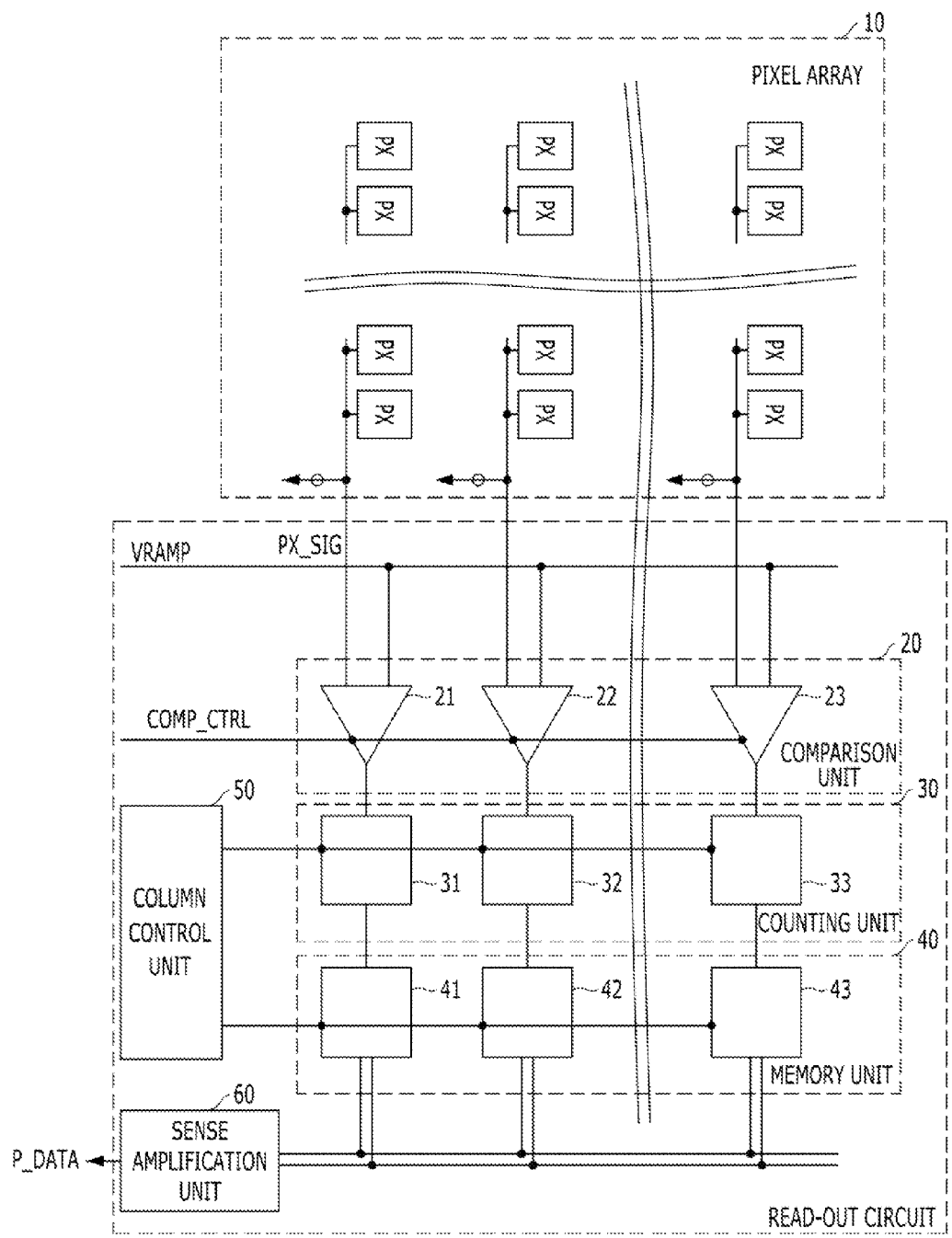
FIG. 1 is a block diagram illustrating a single-slope analog-to-digital converter of a CMOS image sensor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention. Furthermore, "connected/coupled" refers to one component not only directly coupling another component but also indirectly coupling another component, through an intermediate component. In addition, a singular form may include a plural form as long as it is not specifically mentioned in a sentence.

In the description, a single-slope ADC (analog-to-digital converter) is taken as an example. However, it is noted that the present invention is not limited to the single-slope ADC because the present invention may be applied to a multi-slope ADC as well as the single-slope ADC.

FIG. 1 is a block diagram illustrating a single-slope ADC of a CMOS (complementary metal-oxide-silicon) image sensor.

The single-slope ADC (SS-ADC) having a column parallel structure.

Referring to FIG. 1, the single-slope ADC of the CMOS image sensor includes a pixel array 10 for outputting a pixel signal PX_SIG corresponding to incident light, a comparison unit 20, a counting unit 30 for counting an output signal from the comparison unit 20, a memory unit 40 for storing counting information from the counting unit 30, a column control unit 50 for controlling operations of the counting unit 30 and the memory unit 40 and a sense amplification unit 60.

The comparison unit 20 compares a value of the pixel signal PX_SIG outputted from the pixel array 10 with a value of a ramp signal VRAMP, which is applied from an external voltage generation unit (not illustrated), for example, a ramp signal generator or a current ADC (IDAC), in response to a comparator control signal COMP_CTRL received from an external CIS controller (not illustrated) and outputs the comparison result to the counting unit 30. The sense amplification unit 60 amplifies a signal corresponding to data stored in and outputted from the memory unit 40 and outputs pixel data P_DATA.

The comparison unit 20 includes a plurality of comparators 21 to 23, the counting unit 30 includes a plurality of up/down counters 31 to 33, and the memory unit 40 includes a plurality of memories 41 to 43. A memory may substitute for each of the up/down counters 31 to 33.

Next, an analog-to-digital conversion operation will be described with reference to the first comparator 21, the first up/down counter 31, and the first memory 41 as an example.

In a normal mode, the first comparator 21 compares a first pixel signal PX_SIG, which is outputted from a first column pixel of the pixel array 10, with the ramp signal VRAMP, which is applied from the external voltage generation unit in response to the comparator control signal COMP_CTRL received from an exterior.

A voltage level of the ramp signal VRAMP is reduced with the passage of time, and thus there is a time point, at which the values of the first pixel signal PX_SIG and the ramp signal VRAMP coincide with each other, and a value outputted from to the first comparator 21 is inverted at the time point when they coincide.

The up/down counter 31 counts time from when the ramp signal VRAMP starts getting lower to when the output of the comparator 21 is inverted.

The memory 41 stores and outputs counting information generated by the up/down counter 31.

As described above, in the column parallel analog-to-digital conversion structure, the ADC is provided to each column, the value of the pixel signal PX_SIG outputted from each pixel is evaluated through comparison with the ramp signal VRAM and the evaluation result or the counting information for each pixel of every column is outputted.

Figure 2:
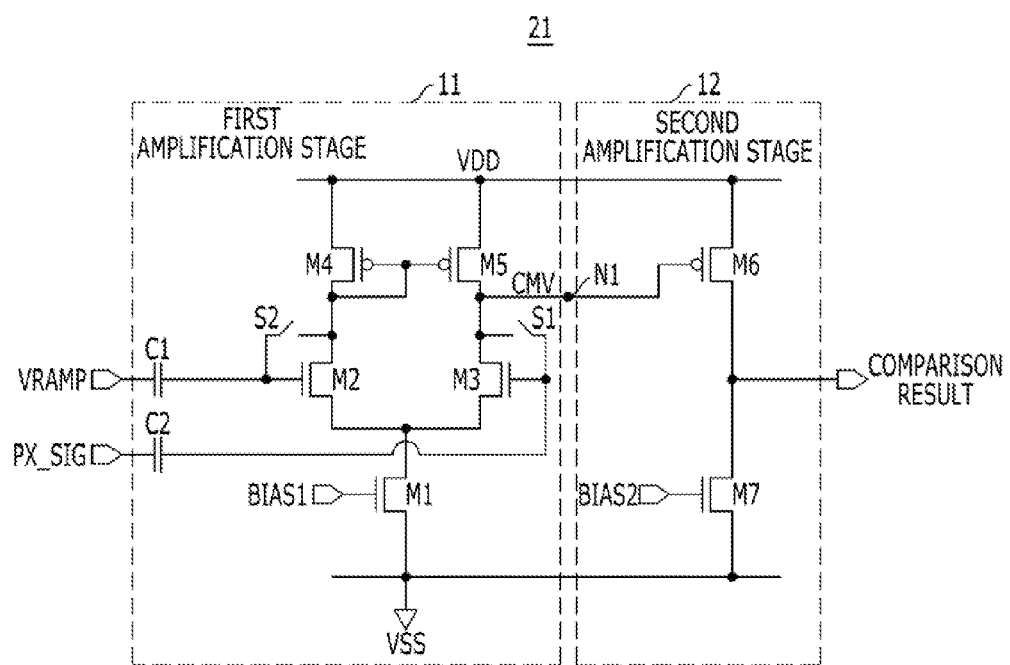
FIG. 2 is a circuit diagram of a comparator shown in FIG. 1.
Figure 3:
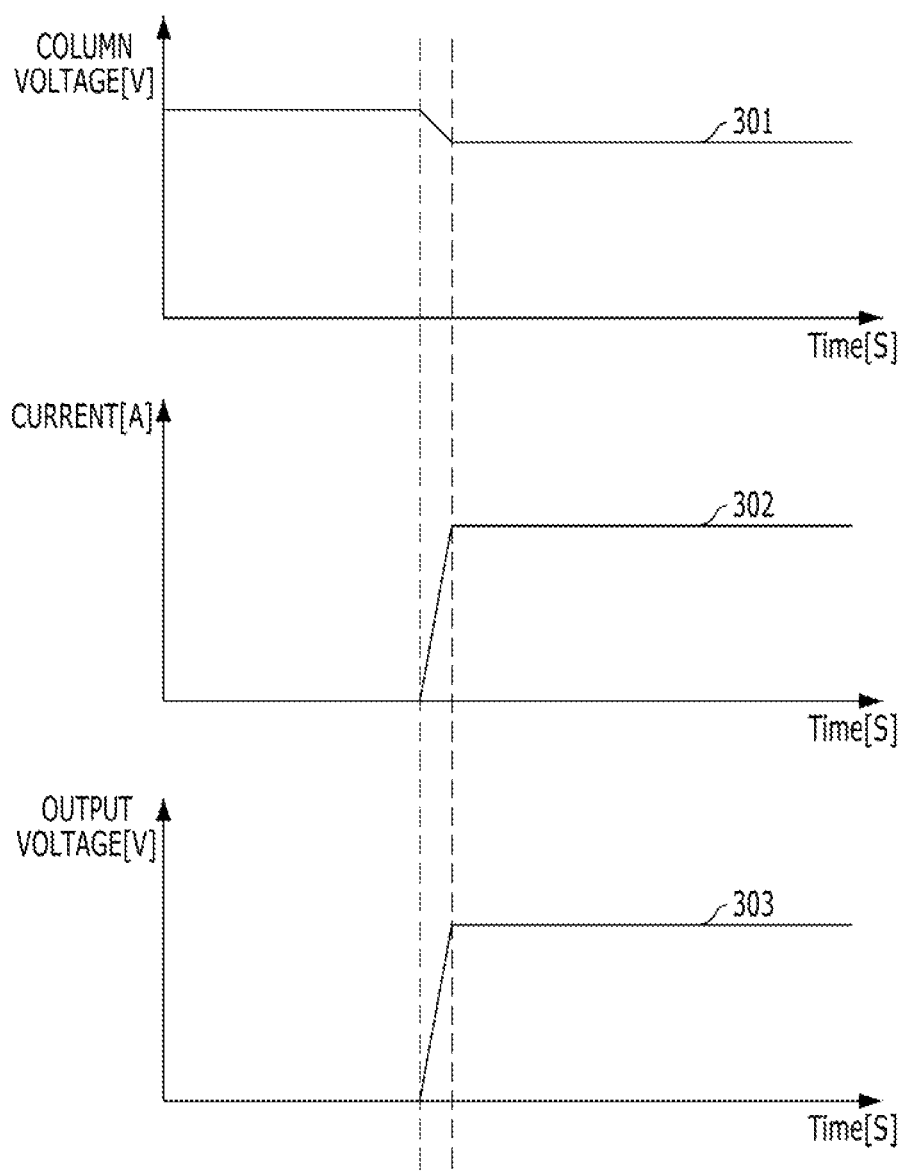
FIG. 3 is a timing diagram illustrating an operation of the comparator.

FIG. 2 is a circuit diagram of the first comparator 21 of the SS-ADC shown in FIG. 1. FIG. 3 is a timing diagram illustrating an operation of the first comparator 21.

FIGS. 2 and 3 show a comparative example. FIG. 3 illustrates a voltage change 303 and a current change 302 of an output terminal of the first comparator 21 and a column voltage 301 or an IR drop of power of all columns due to the voltage change 303 and the current change 302.

Referring to FIG. 2, the first comparator 21 is a two-stage comparator including a first amplification stage 11 and a second amplification stage 12.

The first amplification stage 11 compares the ramp signal VRAMP with the pixel signal PX_SIG and amplifies and outputs a comparison voltage CMV corresponding to a comparison result to the second amplification stage 12. The second amplification stage 12 amplifies the comparison voltage CMV from the first amplification stage 11 and finally outputs the amplified voltage CMV as a comparison result. That is, when the first amplification stage 11 outputs the comparison voltage CMV, which corresponds to a voltage obtained by amplifying a difference between the ramp signal VRAMP and the pixel signal PX_SIG, to the second amplification stage 12, the second amplification stage 12 amplifies the comparison voltage CMV from the first amplification stage 11 and finally outputs the amplified voltage CMV as the comparison voltage.

The first amplification stage 11 includes a target voltage input section, a current mirror section, a first bias section, and an auto-zero section. The target voltage input section generates a first: current flowing through a first path and a second current flowing through a second path based on the ramp signal VRAMP and the pixel signal PX_SIG, and the current mirror section performs a current mirror operation on the first path and the second path and outputs the in comparison voltage CMV to a first node N1. The first bias section generates a bias current corresponding to the sum of the first current and the second current, and the auto-zero section performs an auto-zero operation based on an auto-zero signal (not shown). The target voltage input section includes second and third transistors M2 and M3, the current mirror section includes fourth and fifth transistors M4 and M5, the first bias section includes a first transistor M1, and the auto-zero section includes first and/or second switches S1 and S2.

The second amplification stage 12 includes a sixth transistor M6 that operates in response to a voltage level of the first node N1 and a seventh transistor M7 that allows current based on a second bias voltage BIAS2 to flow or be blocked in response to a voltage level of the comparison result that is outputted to an output terminal.

In detail, the second transistor M2 has a gate receiving the ramp signal VRAMP, a source coupled to a drain of the first transistor M1 and a drain coupled to a drain of the fourth transistor M4. The third transistor M3 has a gate receiving the pixel signal PX_SIG, a source coupled to the drain of the first transistor M1, and a drain coupled to a drain of the fifth transistor M5. The second and third transistors M2 and M3 may be implemented with NMOS transistors. A first capacitor C1 is coupled to the gate of the second transistor M2 and a second capacitor C2 is coupled to the gate of the third transistor M3. The first and second capacitors C1 and C2 remove a direct current component when the ramp signal VRAMP and the pixel signal PX_SIG are applied to the second and third transistors M2 and M3.

The fourth transistor M4 has a gate coupled to a gate of the fifth transistor M5, a source coupled to a first supply voltage VDD, and the drain coupled to the drain of the second transistor M2. The fifth transistor M5 has the gate coupled to the gate of the fourth transistor M4, a source coupled to the first supply voltage VDD, and the drain coupled to the drain of the third transistor M3. The fourth and fifth transistors M4 and M5 may be implemented with PMOS transistors. The gate of the fourth transistor M4 and the gate of the fifth transistor M5 are coupled to the drain of the fourth transistor M4, and the drain of the fifth transistor M5 is coupled to the first node N1 so that the fifth transistor M5 outputs the comparison voltage CMV corresponding to a voltage obtained by amplifying the difference between the ramp signal VRAMP and the pixel signal PX_SIG.

The first transistor M1 has a gate coupled to a first bias voltage BIAS1, a source coupled to a second supply voltage VSS, and the drain coupled to the source of the second transistor M2 and the source of the third transistor M3. The first transistor M1 may be implemented with an NMOS transistor. The first supply voltage VDD corresponds to a power supply voltage and the second supply voltage VSS corresponds to a ground voltage. As described above, the first transistor M1 serves as a current source.

The first switch S1 is coupled between the gate and the drain of the third transistor M3 and the second switch S2 is coupled between the gate and the drain of the second transistor M2. In an auto-zero mode, when the first and second switches S1 and S2 are turned on in response to the auto-zero signal (a switch control signal) the gate and the drain of the second transistor M2 are coupled to each other and the gate and the drain of the third transistor M3 are coupled to each other. As a consequence, since offset of the first amplification stage 11 is stored in the first and second capacitors C1 and C2, the first amplification stage 11 is able to remove a comparison error due to the offset of the first amplification stage 11 when comparing the ramp signal VRAMP with the pixel signal PX_SIG in a comparison mode.

The first amplification stage 11 has a telescopic structure. However, the first amplification stage 11 may have various structures, such as a folded-cascade structure or a current mirror structure, according to required conditions.

The sixth transistor M6 has a gate coupled to the first node N1, a source coupled to the first supply voltage VDD, and a drain coupled to a drain of the seventh transistor M7. The sixth transistor M6 may be implemented with a PMOS transistor. The seventh transistor M7 has a gate coupled to a second bias voltage BIAS2, a source coupled to the second supply voltage VSS, and a drain coupled to the drain of the sixth transistor M6. The seventh transistor M7 may be implemented with an NMOS transistor.

When the ramp signal VRAMP and the pixel signal PX_SIG are applied, the voltage level of the first node N1 reaches a voltage level at which the sixth transistor M6 operates in saturation and is sampled in terms of an operation of the first comparator 21. Then, when the sixth transistor M6 is turned off by the ramp signal and then the first comparator 21 performs a comparison operation according to fluctuation of the ramp signal VRAMP, current flows again.

In the aforementioned column parallel ADC structure of FIG. 1, since the ADC, for example, including the first comparator 21 of FIG. 2 is provided to each column, many more ADCs are necessary as an image size increases.

For this reason, the column parallel ADC structure has a concern that power noise such as current noise, which is generated in a comparator of one column, is reflected in an image by an amount corresponding to the total number of columns. The power noise reflected in the image results in the horizontal noise (HN), Furthermore, the column parallel ADC structure has a concern that output noise is generated in every comparator of the ADC arranged at each of columns. The output noise is voltage noise kicked back from an output terminal of the comparator through a parasitic capacitor.

In this regard, in an exemplary embodiment of the present invention, a technology for compensating for current and removing noise using a replica circuit is proposed, and will be described in detail with reference to FIGS. 4 to 7.

Figure 4:
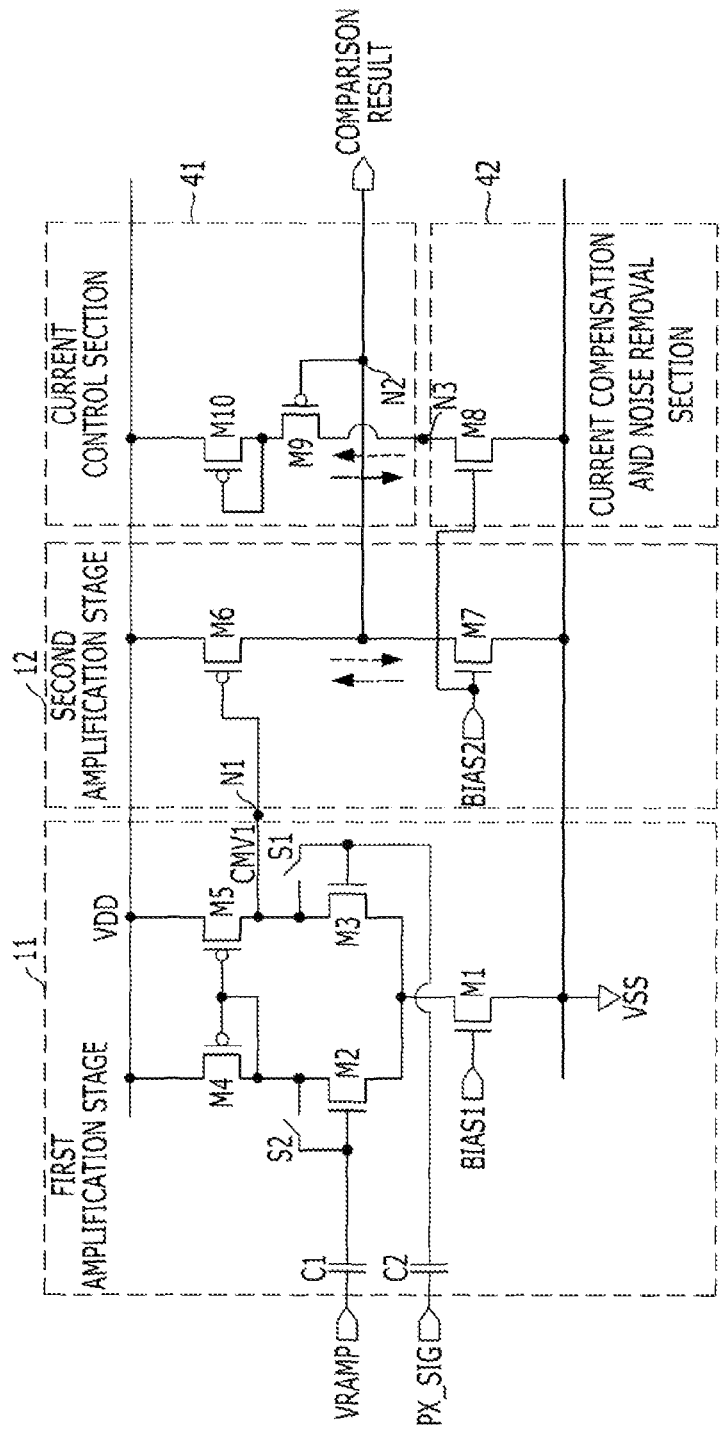
FIG. 4 is a circuit diagram of a comparator according to an exemplary embodiment of the present invention.

FIG. 4 is a circuit diagram of a comparator according to an exemplary embodiment of the present invention.

The comparator 21A shown in FIG. 4 may correspond to the first comparator 21 shown in FIG. 2. The comparator 21A may include the same elements as the first comparator 21 and may further include a current control section 41 and a current compensation and noise removal section 42 in order to minimize a current change as compared with the existing comparator. In FIGS. 2 and 4, like reference numerals refer to the same elements.

Referring to FIG. 4, the comparator 21A may include the first amplification stage 11 that receives and differentially amplifies a pixel signal PX_SIG and a ramp signal VRAMP and outputs the comparison voltage CMV, the second amplification stage 12 that amplifies the comparison voltage CMV and outputs the amplified voltage CMV as the comparison voltage, which is the same as the first comparator 21 shown in FIG. 2.

The comparator 21A may further include the current control section 41 that controls a current flowing between the current control section 41 and the current compensation and noise removal section 42 in response to the comparison voltage outputted from the second amplification stage 12 and the current compensation and noise removal section 42 that compensates for current and removes noise under the control of the current control section 41.

The current control section 41 may include a ninth transistor M9 that is controlled by the comparison voltage from the second amplification stage 12 to control a tenth transistor M10. The tenth transistor M10 that controls a current flowing between the current control section 41 and the current compensation and noise removal section 42 according to a turn-on or turn-off state of the ninth transistor M9.

The current compensation and noise removal section 42 may include an eighth transistor M8 that compensates for the current flow of the current control section 41, and thus removes noise by allowing a current to increase or decrease as the second amplification stage 12 decrease or increase.

The current control section 41 and the current compensation and noise removal section 42 together may serve as a replica of the second amplification stage 12. The current control section 41 and the current compensation and noise removal section 42 together may be controlled by the comparison voltage of the second amplification stage 12 through the ninth transistor M9.

In detail, a gate and a drain of the tenth transistor M10 may be coupled to each other, and a source thereof may be coupled to the first supply voltage VDD. The ninth transistor M9 may have a gate coupled to a second node N2 (an output node), a source coupled to the drain of the tenth transistor M10, and a drain coupled to a drain of the eighth transistor M8. The ninth and tenth transistors M9 and M10 may be implemented with PMOS transistors.

The eighth transistor M8 may have a gate coupled to the second bias voltage BIAS2, a source coupled to the second supply voltage VSS, and the drain coupled to the drain of the ninth transistor M9. The eighth transistor M8 may be implemented with an NMOS transistor.

When a value of the pixel signal PX_SIG and an initial value of the ramp signal VRAMP are sampled by the first and second switches S1 and S2, a specific voltage may be sampled at the first node N1. When the voltage level of the first node N1 is increased by the applied pixel signal PX_SIG and the ramp signal VRAMP, the sixth transistor M6 may be turned off and the voltage level of the second node N2 falls to the ground GND so that no current flows through the seventh transistor M7.

As the voltage level of the second node N2 falls to the ground GND, the ninth transistor M9 may be turned on and a current with substantially the same amount as the current, which flows through the second amplification stage 12 during turn on of the sixth transistor M6, may flow through the current control section 41 and the current compensation and noise removal section 42 by the second bias voltage BIAS2 because the current control section 41 and the current compensation and noise removal section 42 together may be the replica of the second amplification stage 12 with the tenth transistor M10 and the eighth transistor M8 having the same characteristics (for example, a same size, an adjacent position, and same swing) as those of the sixth transistor M6 and the seventh transistor M7, respectively.

When the comparator 21A operates according to fluctuation of the ramp signal VRAMP and performs evaluation of the pixel signal PX_SIG, the voltage level of the second node N2 may increase to a high level, the seventh transistor M7 may allow current to flow by the second bias voltage BIAS, the ninth transistor M9 may be turned off, and the eighth transistor M8 does not allow current to flow so that it is possible to reduce current noise that is generated by a change iii a current profile generated during operation of the comparator 21A.

In more detail, the ninth transistor M9 may be turned off when the second node N2 reaches a high level while being turned on when the second node N2 reaches a low level. Accordingly, a voltage level of a third node N3, to which the ninth transistor M9 and the eighth transistor M8 are coupled, may be opposite to the voltage level of the second node N2. Thus, in terms of the second bias voltage BIAS2 coupled to both of the seventh transistor M7 and the eighth transistor M8, the voltage level of the second node N2 may swing from a low level to a high level while the voltage level of the third node N3 may swing from a high level to a low level so that it is possible to reduce voltage noise that is kicked back through a parasitic capacitor. Further, the amount of the current flowing through the eighth transistor M8 may change inversely to the amount of the seventh transistor M7, and thus the total current is constant so that it is possible to reduce fluctuation of total power.

When each of the first and second switches S1 and S2 is on, gate voltages of the second transistor M2 and the third transistor M3 are substantially equal to each other by common mode feedback. After the voltage values are sampled, a gate voltage of the sixth transistor M6 may increase as the offset of the ramp signal VRAMP is applied so that the sixth transistor M6 is turned off. Accordingly, when the voltage level of the second node N2 falls to a low level, the ninth transistor M9 is turned on so that current set by the second bias voltage BIAS2 flows through the tenth transistor M10, the ninth transistor M9 and the eighth transistor M8. As described above, the sixth transistor M6 and the tenth transistor M10 may have the same characteristics.

When the input of the ramp signal VRAMP is ramped down and the voltage level of the ramp signal VRAMP is lower than the voltage level of the pixel signal PX_S1G, the gate voltage of the sixth transistor M6 falls to a low level and the sixth transistor M6 is turned on so that the current based on the second bias voltage BIAS2 flows through the sixth transistor M6 and the seventh transistor M7. Thus, since the voltage level of the second node N2 is transitioned from a low level to a high level, the ninth transistor M9 is turned off. Thus, no current flows through the eighth transistor M8 and the drain of the eighth transistor M8 reaches a low level.

At this time, the amount of the voltage noise kicked back from the drain of the seventh transistor M7 to the second bias voltage terminal through the parasitic capacitor and the amount of the voltage noise kicked back from the drain of the eighth transistor M8 to the second bias voltage terminal through the parasitic capacitor may be approximately equal to each other, and thus cancel each other because the seventh transistor M7 and the eighth transistor M8 may have the same characteristics.

Figure 5:
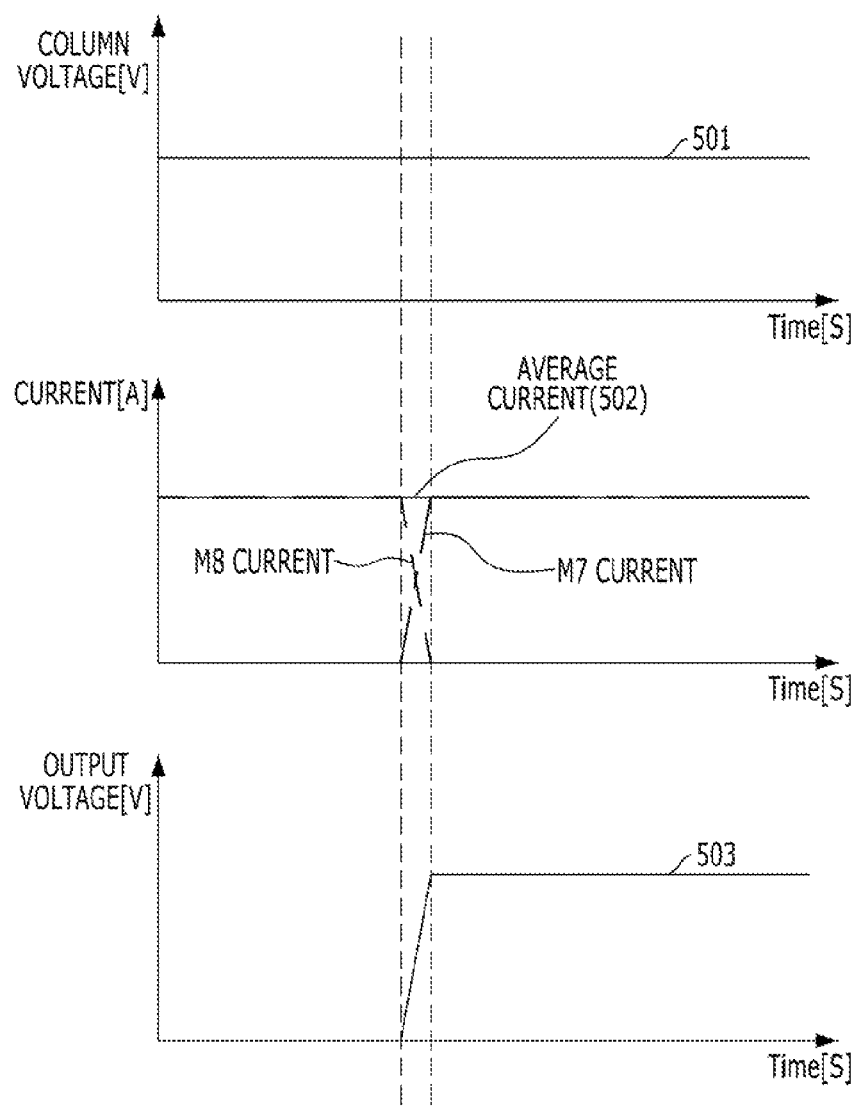
FIG. 5 is a timing diagram illustrating an operation of the comparator shown in FIG. 4.

FIG. 5 is a timing diagram illustrating an operation of the comparator 21A shown in FIG. 4.

FIG. 5 illustrates voltage and current changes and an effect for total power during operation of the comparator 21A.

FIG. 5 illustrates a voltage change 503 of an output terminal of the comparator 21A, an average current 502 of an output terminal of the comparator 21A by the eighth transistor M8 and the seventh transistor M7 and a column voltage 501 of all columns due to the voltage change 503 and the average current 502.

As shown in FIG. 5 the current flowing through the eighth transistor M8 and the current flowing through the seventh transistor M7 are swapped so that the total current is constantly maintained.

Figure 6:
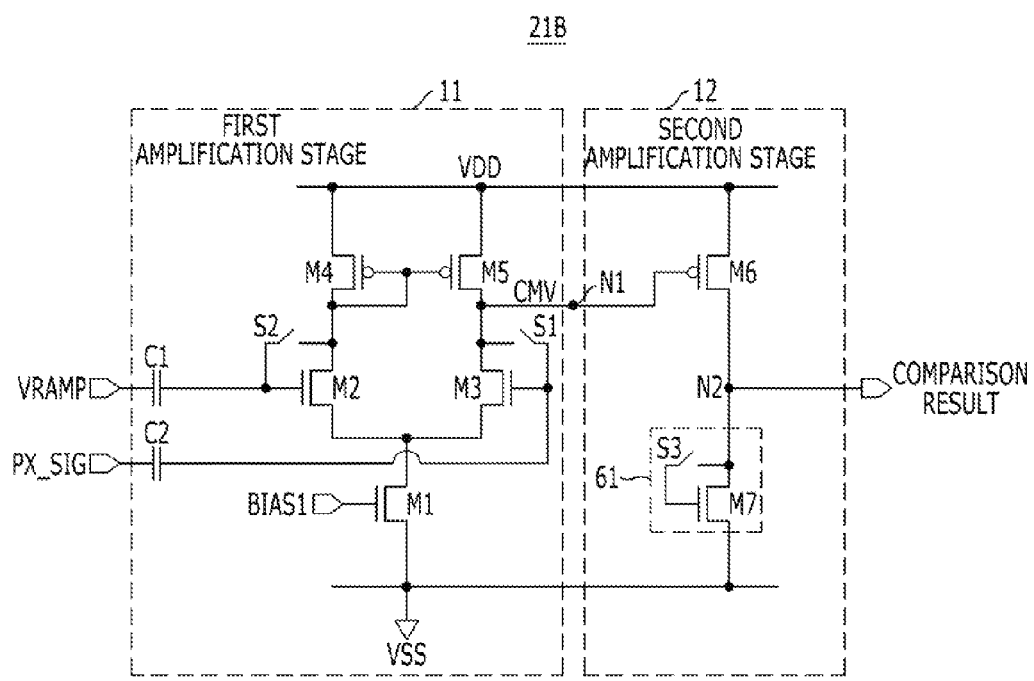
FIG. 6 is a circuit diagram of a comparator.

FIG. 6 is a circuit diagram of a comparator.

FIG. 6 shows another comparative example having a sampling scheme structure.

The first comparator 21 shown in FIG. 2 uses the second bias voltage BIAS2 applied from the outside. The comparator 21B shown in FIG. 6 samples a bias voltage.

In detail, a third switch S3 is coupled between the gate and the drain of the seventh transistor M7, the source of the seventh transistor M7 is coupled to the second supply voltage VSS, and the drain of the seventh transistor M7 is coupled to the drain of the sixth transistor M6. Since the comparator 21B shown in FIG. 6 is the same as the first comparator 21 shown in FIG. 2 except for sampling structure 61 of the bias voltage.

Figure 7:
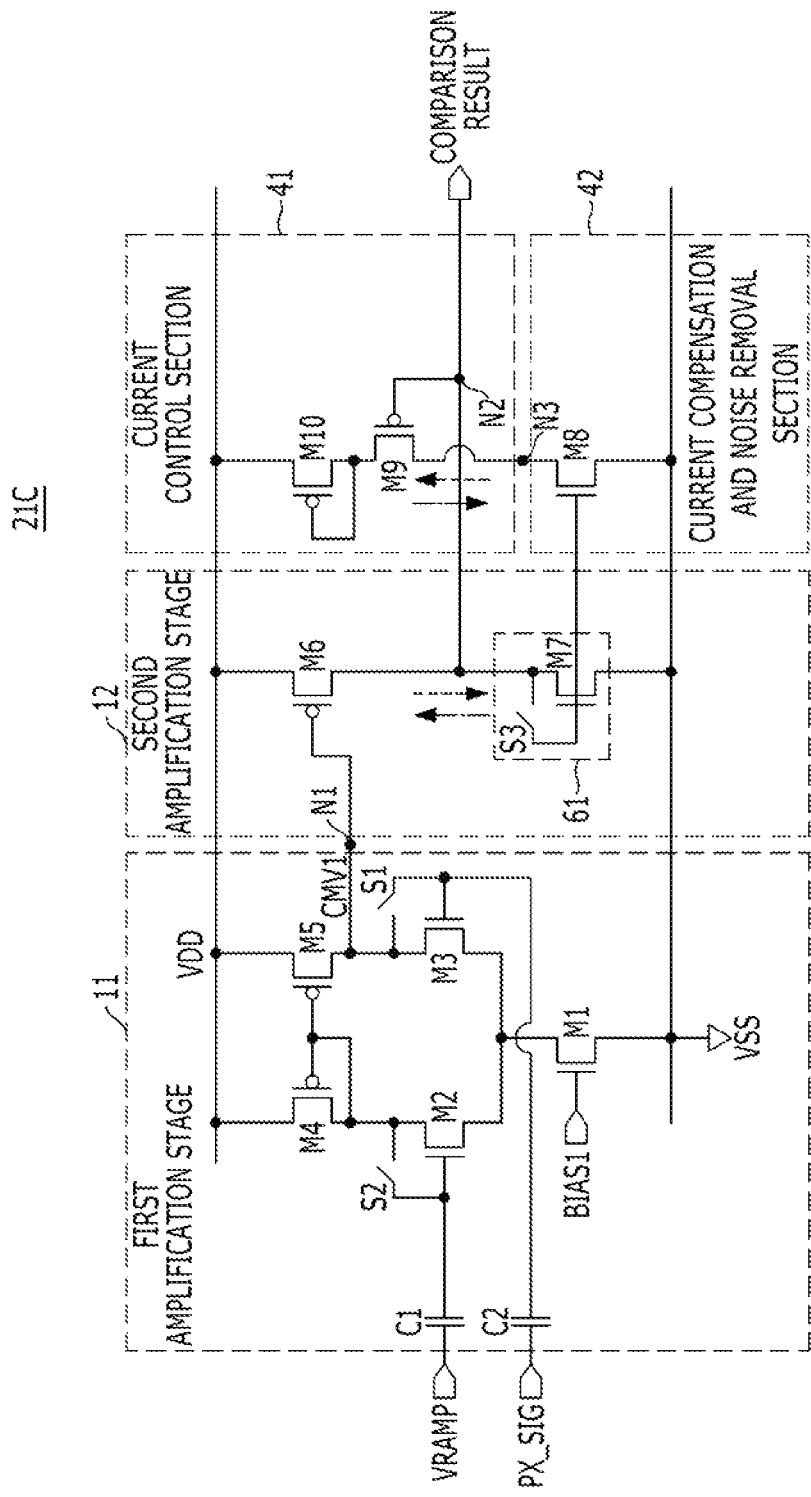
FIG. 7 is a circuit diagram of a comparator according to an exemplary embodiment of the present invention.

FIG. 7 is a circuit diagram of a comparator according to an exemplary embodiment of the present invention.

As illustrated in FIG. 7, the seventh transistor M7 and the eighth transistor M8 in the comparator 21C may share a sampling node so that substantially the same amount of current flows through the second amplification stage 12 and both of the current flow of the current control section 41 and the current compensation and noise removal section 42.

In detail, a third switch S3 is coupled between the gate and the drain of the seventh transistor M7, the source of the seventh transistor M7 is coupled to the second supply voltage VSS, and the drain of the seventh transistor M7 is coupled to the drain of the sixth transistor M6. The eighth transistor M8 may have the gate coupled to the gate of the seventh transistor M7, the source coupled to the second supply voltage VSS, and the drain coupled to the drain of the ninth transistor M9.

When a value of the pixel signal PX_SIG and an initial value of the ramp signal VRAMP are sampled by the first and second switches S1 and S2, a specific voltage may be sampled at the first node N1, at which a bias voltage is sampled according to the operation of the third switch S3. When the voltage level of the first node N1 is increased by the applied pixel signal PX_SIG and ramp signal VRAMP, the sixth transistor M6 may be turned off and the voltage level of the second node N2 falls to the ground GND so that no current flows through the seventh transistor M7.

As the voltage level of the second node N2 falls to the ground GND, the ninth transistor M9 may be turned on and a current with substantially the same amount of the current, which flows through the second amplification stage 12 during turn on of the sixth transistor M6, may flow through the current control section 41 and the current compensation and noise removal section 42 by the sampled bias voltage because the current control section 41 and the current compensation and noise removal section 42 together may be the replica of the second amplification stage 12 with the tenth transistor M10 and the eighth transistor M8 having the same characteristics as those of the sixth transistor M6 and the seventh transistor M7, respectively.

When the comparator 21C operates according to fluctuation of the ramp signal and performs evaluation of the pixel signal PX_SIG, the voltage level of the second node N2 may increase to a high level, the seventh transistor M7 may allow current to flow by the sampled bias voltage through the third switch S3, the ninth transistor M9 may be turned off and the eighth transistor M8 does not allow current to flow so that it is possible to reduce current noise that is generated by a change in a current profile generated during operation of the comparator 21C. The other structures and operations are the same as the comparator 21A described with reference to FIG. 4.

As described above, the comparator according to the embodiments of the present invention may compensate for current to reduce power noise (for example, current noise) and remove output noise (for example, voltage noise) due to output swing.

For example, the bias voltage coupled to the seventh transistor M7 and the eighth transistor M8 samples a bias level through mirroring or sampling and several thousands of the comparison voltages outputted from the comparators swing a voltage of 2.8 V, which makes the bias voltage unstable. In accordance with the embodiments of the present invention, the current control section 41 and the current compensation and noise removal section 42 together may serve as the replica of the second amplification stage 12 with the tenth transistor M10 and the eighth transistor M8 having the same characteristics as those of the sixth transistor M6 and the seventh transistor M7, respectively, so that voltages with opposite polarities may be cancelled at the bias voltage terminal thereby removing voltage noise kicked back through the parasitic capacitor.

The comparators 21A and 21C respectively described with respect to FIGS. 4 and 7 according to the embodiments of the present invention may be applied to the single-slope ADC illustrated in FIG. 1, and the like.

According to the embodiments of the present invention, it is possible to reduce horizontal noise (HN) by removing power noise (for example, current noise) generated from the comparator of the single-slope ADC (SS-ADC). Furthermore, it is possible to remove output noise (for example, voltage noise) that is kicked back from the output terminal of the comparator through the parasitic capacitor.

While the present invention has been described with respect to the specific embodiments, it will be apparent to those skilled in the art that various changes and modifications may be made without departing from the spirit and scope of the invention as defined in the following claims.

What is claimed is:

1. A comparator comprising:
a first amplification unit suitable for differentially amplifying a pixel signal and a ramp signal;
a second amplification unit suitable for amplifying a signal outputted from the first amplification unit and outputting a comparison result;
a current control unit suitable for controlling a current flow in response to the comparison result; and
a current compensation and noise removal unit suitable for compensating for current and removing noise under control of the current control unit,
wherein the current control unit comprises:
a second transistor including a replica circuit having same characteristics as a third transistor provided in the second amplification unit.

2. The comparator of claim 1, wherein the current control unit further comprises:
a first transistor that is turned on or off in response to the comparison result,
wherein the second transistor controls a current flow between the current control unit and the current compensation and noise removal unit according to a turn-on or turn-off state of the first transistor.

3. The comparator of claim 2, wherein the current compensation and noise removal unit comprises:
a fourth transistor suitable for compensating for current and removing noise through a current increase/decrease flow, which is opposite to a current decrease/increase flow of the second amplification unit, in response to the turn-on or turn-off state of the first transistor.

4. The comparator of claim 3, wherein the fourth transistor includes a replica circuit having the same characteristics as a fifth transistor provided in the second amplification unit.

5. The comparator of claim 4, wherein current flowing through the fourth transistor and current flowing through the fifth transistor are swapped so that a total current is constantly maintained.

6. The comparator of claim 3, wherein the fourth transistor has a gate coupled to a second bias voltage, a source coupled to a second supply voltage and a drain coupled to a drain of the first transistor.

7. The comparator of claim 3, wherein the first transistor has a gate coupled to an output node, a source coupled to a drain of the second transistor, and a drain coupled to a drain of the fourth transistor, and
the second transistor has a gate and the drain coupled to each other and a source coupled to a first supply voltage.

8. The comparator of claim 1, wherein the current compensation and noise removal unit comprises a sixth transistor including a replica circuit having the same characteristics as those of a fifth transistor provided in the second amplification unit.

9. The comparator of claim 8, wherein the fifth transistor and the sixth transistor share a sampling node so that substantially the same amount of current flows.

10. The comparator of claim 9, wherein the sixth transistor has a gate coupled to a gate of the fifth transistor, a source coupled to a second supply voltage, and a drain coupled to a drain of a first transistor provided in the current control unit.

11. An analog-to-digital converter comprising:
a comparison unit suitable for comparing a pixel signal with a ramp signal, outputting a comparison result and controlling a current flow in response to the comparison result to compensate for current and to remove noise; and
a counting unit suitable for counting the comparison result,
wherein the comparison unit comprises:
a first amplification unit suitable for differentially amplifying the pixel signal and the ramp signal;
a second amplification unit suitable for amplifying a signal outputted from the first amplification unit and outputting a comparison result; and
a current control unit suitable for controlling a current flow in response to the comparison result,
wherein the current control unit comprises:
a second transistor including a replica circuit having same characteristics as a third transistor provided in the second amplification unit.

12. The analog-to-digital converter of claim 11, wherein the comparison unit further comprises:

a current compensation and noise removal unit suitable for compensating for current and removing noise under control of the current control unit.

13. The analog-to-digital converter of claim 12, wherein the current control unit further comprises:
a first transistor that is turned on or off in response to the comparison result,
wherein the second transistor controls a current flow between the current control unit and the current compensation and noise removal unit according to a turn-on or turn-off state of the first transistor.

14. The analog-to-digital converter of claim 13, wherein the current compensation and noise removal unit comprises:
an fourth transistor suitable for compensating for current and removing noise through a current increase/decrease flow, which is opposite to a current decrease/increase flow of the second amplification unit, in response to the turn-on or turn-off state of the first transistor.

15. The analog-to-digital converter of claim 14, wherein the fourth transistor includes a replica circuit having the same characteristics as those of a fifth transistor provided in the second amplification unit.

16. The analog-to-digital converter of claim 15, wherein current flowing through the fourth transistor and current flowing through the fifth transistor are swapped so that a total current is constantly maintained.

17. The analog-to-digital converter of claim 12, wherein the current compensation and noise removal unit comprises a sixth transistor that including a replica circuit having the same characteristics as those of a fifth transistor provided in the second amplification unit.

18. The analog-to-digital converter of claim 17, wherein the fifth transistor and the sixth transistor share a sampling node so that substantially a same amount of current flows.

19. A comparator comprising:
a first amplification unit suitable for comparing a pixel signal and a ramp signal;
a second amplification unit suitable for amplifying an output of the first amplification unit and outputting a comparison result to an output terminal of the comparator; and
a replica unit suitable for generating a first inner current flow in response to the comparison result,
wherein the second amplification unit and the replica unit are commonly coupled to the output terminal of the comparator,
wherein the second amplification unit generate a second inner current flow during activated, and
wherein the replica unit changes an amount of the first inner current flow inversely to the amount of a second inner current,
wherein the replica unit has same characteristics as a transistor provided in the second amplification unit.

* * * * *